US009563985B2

(12) United States Patent
Fish et al.

(10) Patent No.: US 9,563,985 B2
(45) Date of Patent: Feb. 7, 2017

(54) GRAPHICAL USER INTERFACE WITH ENLARGED DATA WINDOW FUNCTION

(71) Applicant: Service Solutions U.S. LLC, Warren, MI (US)

(72) Inventors: James Fish, Birmingham, MI (US); David Richard Moulton, Holt, MI (US); Kevin Gray, Kalamazoo, MI (US)

(73) Assignee: Bosch Automotive Service Solutions Inc., Warren, MI (US)

( * ) Notice: Subject to any disclaimer, the term of this patent is extended or adjusted under 35 U.S.C. 154(b) by 144 days.

(21) Appl. No.: 13/955,859

(22) Filed: Jul. 31, 2013

(65) Prior Publication Data

US 2014/0277914 A1    Sep. 18, 2014

Related U.S. Application Data

(60) Provisional application No. 61/793,081, filed on Mar. 15, 2013.

(51) Int. Cl.
*G06F 3/048* (2013.01)
*G07C 5/00* (2006.01)
*G06F 3/0481* (2013.01)
*G06F 3/0484* (2013.01)
*G06F 3/0488* (2013.01)

(52) U.S. Cl.
CPC ............... *G07C 5/008* (2013.01); *G06F 3/048* (2013.01); *G06F 3/04817* (2013.01); *G06F 3/04842* (2013.01); *G06F 3/04886* (2013.01); *G07C 2205/02* (2013.01)

(58) Field of Classification Search
None
See application file for complete search history.

(56) References Cited

U.S. PATENT DOCUMENTS

| 6,137,470 | A | 10/2000 | Sundstrom et al. |
| 6,219,701 | B1 | 4/2001 | Hirata et al. |
| 6,229,536 | B1 * | 5/2001 | Alexander ........... G01R 13/345 345/440 |
| 6,498,613 | B1 | 12/2002 | Wajima |
| 7,612,737 | B2 | 11/2009 | Bright et al. |
| 8,499,256 | B1 | 7/2013 | Iten et al. |
| 8,509,986 | B1 | 8/2013 | Chen |
| 8,522,165 | B2 | 8/2013 | Cameron et al. |
| 8,548,674 | B2 | 10/2013 | Namaky |
| 8,626,375 | B2 | 1/2014 | Miller et al. |

(Continued)

OTHER PUBLICATIONS

MaxiDAS DS708 Demo-2007 VW Golf 2.0TDi: was accessed on Mar. 6, 2015 at https://www.youtube.com/watch?v=_IWUnKQjWyo. This was posted on May 2, 2012.*

(Continued)

*Primary Examiner* — Truc M Do
*Assistant Examiner* — Jess Whittington
(74) *Attorney, Agent, or Firm* — Baker Hostetler LLP

(57) ABSTRACT

A graphical user interface is provided that can be used on a diagnostic tool. The graphical user interface allows a technician to operate various functions of the diagnostic tool including searching for additional information on the Internet, receiving weather information that is relevant to certain diagnostic tests, and displaying in certain formats the retrieved vehicle data and when certain vehicles were last scanned or diagnosed.

20 Claims, 10 Drawing Sheets

(56) References Cited

U.S. PATENT DOCUMENTS

| | | | |
|---|---|---|---|
| 2001/0030624 A1 | 10/2001 | Schwoegler | |
| 2004/0039494 A1 | 2/2004 | Kaufman | |
| 2004/0086184 A1 | 5/2004 | Kondo et al. | |
| 2005/0120306 A1 | 6/2005 | Klassen et al. | |
| 2006/0178791 A1* | 8/2006 | Fountain | G06F 11/263 702/123 |
| 2007/0010922 A1 | 1/2007 | Buckley | |
| 2007/0156311 A1* | 7/2007 | Elcock | G07C 5/008 701/31.4 |
| 2008/0119981 A1 | 5/2008 | Chen | |
| 2009/0045937 A1* | 2/2009 | Zimmerman | G08B 17/00 340/506 |
| 2009/0144622 A1 | 6/2009 | Evans et al. | |
| 2009/0300548 A1* | 12/2009 | Sullivan | G06F 3/0482 715/830 |
| 2010/0064235 A1 | 3/2010 | Walls | |
| 2010/0220113 A1* | 9/2010 | Kennedy | G01C 23/00 345/660 |
| 2010/0256864 A1 | 10/2010 | Ying | |
| 2011/0141921 A1* | 6/2011 | Reese | H04L 41/5032 370/252 |
| 2011/0163969 A1* | 7/2011 | Anzures | G06F 3/04883 345/173 |
| 2011/0224866 A1 | 9/2011 | Chen | |
| 2011/0246018 A1 | 10/2011 | Bertosa et al. | |
| 2012/0056878 A1* | 3/2012 | Miyazawa | G06F 1/1626 345/419 |
| 2012/0215398 A1 | 8/2012 | Chen et al. | |
| 2012/0289147 A1* | 11/2012 | Raleigh | H04L 67/2847 455/3.06 |
| 2012/0303548 A1* | 11/2012 | Johnson | G06Q 40/04 705/36 R |
| 2013/0166139 A1 | 6/2013 | Lipscomb et al. | |
| 2013/0197741 A1 | 8/2013 | Bertosa et al. | |
| 2013/0304278 A1 | 11/2013 | Chen | |
| 2013/0317694 A1 | 11/2013 | Merg et al. | |
| 2014/0075356 A1 | 3/2014 | Gray et al. | |
| 2014/0075362 A1 | 3/2014 | Gray et al. | |
| 2014/0096608 A1 | 4/2014 | Themm et al. | |

OTHER PUBLICATIONS

Hella Gutmann Solutions Mega Macs 66 Introduction Video: was acessed on Mar. 6, 2015 at https://www.youtube.com/watch?v=RGno5ah00CY. This was posted on Jul. 4, 2012.*
U.S. Office Action dated Feb. 28, 2014, in U.S. Appl. No. 13/955,572.
U.S. Office Action dated Jun. 23, 2014, in U.S. Appl. No. 13/955,572.
U.S. Office Action dated Oct. 16, 2014, in U.S. Appl. No. 13/955,572.
U.S. Office Action dated May 14, 2015, in U.S. Appl. No. 13/955,572.
U.S. Office Action dated Mar. 24, 2015, in U.S. Appl. No. 13/955,506.
U.S. Office Action dated Feb. 24, 2014, in U.S. Appl. No. 13/955,663.
U.S. Office Action dated Aug. 1, 2014, in U.S. Appl. No. 13/955,663.
U.S. Office Action dated Jun. 29, 2015, in U.S. Appl. No. 13/955,663.

* cited by examiner

GRAPHICAL USER INTERFACE WITH ENLARGED DATA WINDOW FUNCTION

CROSS-REFERENCE TO RELATED APPLICATIONS

This application claims the benefit of U.S. patent application entitled, GRAPHICAL USER INTERFACE, filed Mar. 15, 2013, having a Ser. No. 61/793,081, the disclosure of which is hereby incorporated by reference in its entirety.

FIELD OF THE DISCLOSURE

The present disclosure relates generally to a graphical user interface. More particularly, the present disclosure relates to a graphical user interface with enlarged data window for use with a computing device, such as a diagnostic tool.

BACKGROUND

In many industries, diagnostic systems play an increasingly important role in manufacturing processes, as well as in maintenance and repair throughout the lifetime of the equipment or product. Some diagnostic systems are based on personal computer technology and feature user-friendly, menu-driven diagnostic applications. These systems assist technicians and professionals at all levels in performing system diagnostics.

With equipment and products becoming more advanced, more complex, and more expensive with the addition of electronic components, the knowledge base and financial resources required to properly use, maintain, and fix these items have grown immensely. Different diagnostic systems are built with varying capabilities to perform various functions. For example, some diagnostic systems may include a simple code reader, while other diagnostic systems include complex computer architectures.

The menus on the diagnostic tools that have complex computer architectures tend to be burdensome and require a lot of navigation to return to a location so that additional functions can be performed by the diagnostic tool. Thus, there is a need for a diagnostic hub in the form of a graphical user interface (GUI) that provides easier navigation for the user.

Accordingly, it is desirable to provide a graphical user interface that is flexible, intuitive and easy-to-use for a technician to diagnose the equipment or product, such as a vehicle.

SUMMARY

The foregoing needs are met, to a great extent, by the present disclosure, wherein in one aspect of an apparatus is provided in some embodiments to include a graphical user interface with various functionality including searching capabilities; visually indicating when a vehicle was last scanned; displaying "teaser" screens; displaying which on board and off board tools or assets are available for a particular vehicle data; and changing icon display characteristics including location on the screen.

In one embodiment, a diagnostic tool is provided and includes a processor that performs a function of the diagnostic tool, a display in communication with the processor, a wireless communication interface in communication with the processor and configured to communicate with a remote device having at least a remote diagnostic database, a vehicle communication protocol interface operatively coupled to the processor and configured to allow the processor to communicate with a vehicle under test to retrieve diagnostic information including diagnostic trouble codes (DTCs) and data streams, a memory in communication with the processor. The memory containing instructions, that when executed by the processor causes the processor to generate, on the display, a graphical user interface (GUI). The GUI can include a message banner positioned on first portion of the GUI that includes information about the data stream, and a plurality of selectable icons positioned on a second portion of the GUI and correspond to a plurality of data streams retrieved by the diagnostic tool, wherein each of the plurality of selectable icons is sizeable.

In another embodiment, a non-transitory machine-readable storage medium that includes machine-readable instructions for causing a processor of a diagnostic tool to execute the method that includes generating, on the display, a graphical user interface (GUI) that may include a message banner positioned on first portion of the GUI that includes information about the data stream, and a plurality of selectable icons positioned on a second portion of the GUI and correspond to a plurality of data streams retrieved by the diagnostic tool, wherein each of the plurality of selectable icons is sizeable.

In still another embodiment, a computer-implemented method for resizing icons on a display of a diagnostic tool, the method may include generating, on the display, a graphical user interface (GUI). The GUI can include a message banner positioned on first portion of the GUI that includes information about the data stream, and a plurality of selectable icons positioned on a second portion of the GUI and correspond to a plurality of data streams retrieved by the diagnostic tool, wherein each of the plurality of selectable icons is sizeable.

There has thus been outlined, rather broadly, certain embodiments of the disclosure in order that the detailed description thereof herein may be better understood, and in order for the present contribution to the art may be better appreciated. There are, of course, additional embodiments of the disclosure that will be described below and which will form the subject matter of the claims appended hereto.

In this respect, before explaining at least one embodiment of the disclosure in detail, it is to be understood that the disclosure is not limited in its application to the details of construction and to the arrangements of the components set forth in the following description or illustrated in the drawings. The disclosure is capable of embodiments in addition to those described and of being practiced and carried out in various ways. Also, it is to be understood that the phraseology and terminology employed herein, as well as the abstract, are for the purpose of description and should not be regarded as limiting.

As such, those skilled in the art will appreciate that the conception upon which this disclosure is based may readily be utilized as a basis for the designing of other structures, methods and systems for carrying out the several purposes of the present disclosure. It is important, therefore, that the claims be regarded as including such equivalent constructions insofar as they do not depart from the spirit and scope of the present disclosure.

BRIEF DESCRIPTION OF THE DRAWINGS

FIG. 6 illustrates a screen having on board and off-board indicators according to an embodiment of the disclosure.

FIG. 7 illustrates a GUI having icons with vehicle diagnostic data according to an embodiment of the disclosure.

DETAILED DESCRIPTION

Figure 1:
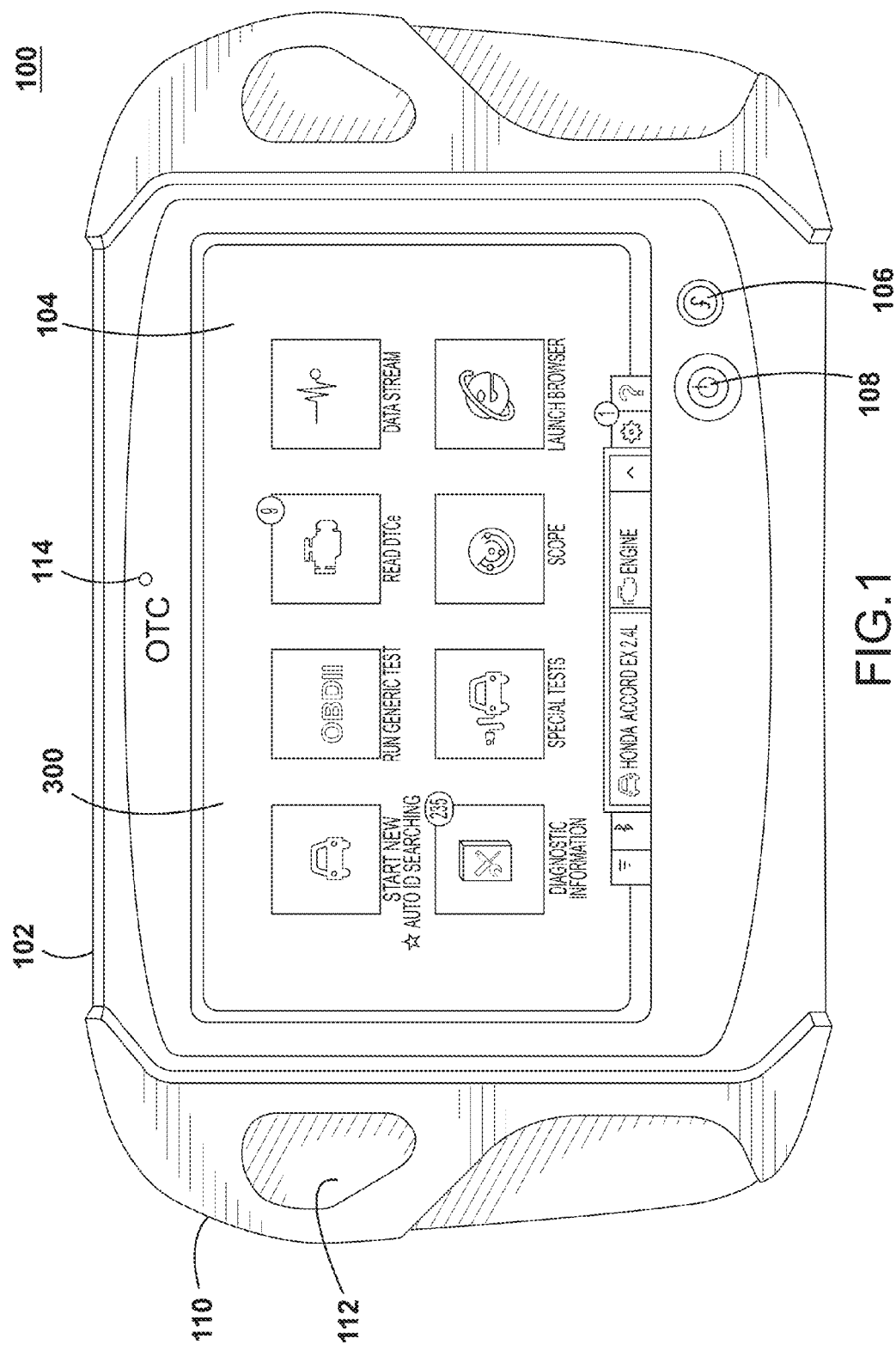
FIG. 1 depicts a front view of a diagnostic tool according to an exemplary embodiment of the present disclosure.

The disclosure will now be described with reference to the drawing figures, in which like reference numerals refer to like parts throughout. An embodiment in accordance with the present disclosure provides a graphical interface for use on a computing device, such as a diagnostic tool, notebook, tablet, smart phone and the like.

FIG. 1 illustrates a front view of a diagnostic tool 100 according to an embodiment of the disclosure. An example of the diagnostic tool is the Genisys® Touch from Service Solutions U.S. LLC (Owatonna, Minn.). The diagnostic tool 100 may include a housing 102, a display 104, a function button or a user interface 106, a power button 108, gripping portions 110 having a finger (thumb) receiving portion 112, a camera 114 and graphical user interface 300 (discussed below). The power button 108 can also be used to put the diagnostic tool 100 into a standby mode in order to save battery power when not in use.

The gripping portions 110 may be made of a polymer including hydrogels for easy gripping. The finger receiving portion 112 may be configured to receive a finger, such as a thumb of the user, to assist in better gripping of the diagnostic tool 100. The function button or user interface 106 may be configured for any function desired by the user including enter, back, forward, left, right, up, down, transmit, receive, return, start over, and the like. The function button can also include multiple functions of any combination of functions, such as enter and then back, etc. The user interface 106 may also include a keyboard having numbers and letters and/or be alphanumeric and the like.

The display 104 can be any type of display including a touch screen display, LCD, LED, VGA, OLED, SVGA, and other types of displays. The display 104 may be a colored, non-colored (e.g. gray scale), or a combination of both. The display 104 can display information such as the make, model, year of vehicle that the diagnostic tool 100 can diagnose, the various diagnostic tests the diagnostic tool can run, diagnostic data the diagnostic tool has received, the baseline data of the various components in a vehicle, part images, parts information, and information from remote servers (internet, database information, etc.). Additionally, the display can show videos for the user to view, and the accompanying audio can be heard via the built in speakers (not shown). The speakers can be a single speaker or multiple speakers for stereo sound. A microphone (not shown) may be included and allows the technician to record information such as the noise being made by the vehicle for later analysis or for comparison with stored data. Further, the technician can also record comments or notes during the testing for later retrieval and analysis.

In one embodiment, the display allows the user to input selection through the touch screen for interactive navigation and selection, wherein the technician can select a menu item or icons (further discussed below) by touching the selection on the graphical user interface (GUI) 300. Additionally, the display 104, when tapped or touched, can also be used to wake up the diagnostic tool 100 if it is in a sleep mode.

The camera 114 may be positioned to face the user so that the user may conduct a video chat with another person at a remote location. The camera may also be positioned on any surface of the diagnostic tool 100 including on the opposite side of display 104 so that images of parts of an engine or any components desired by the user can be taken.

Figure 2:
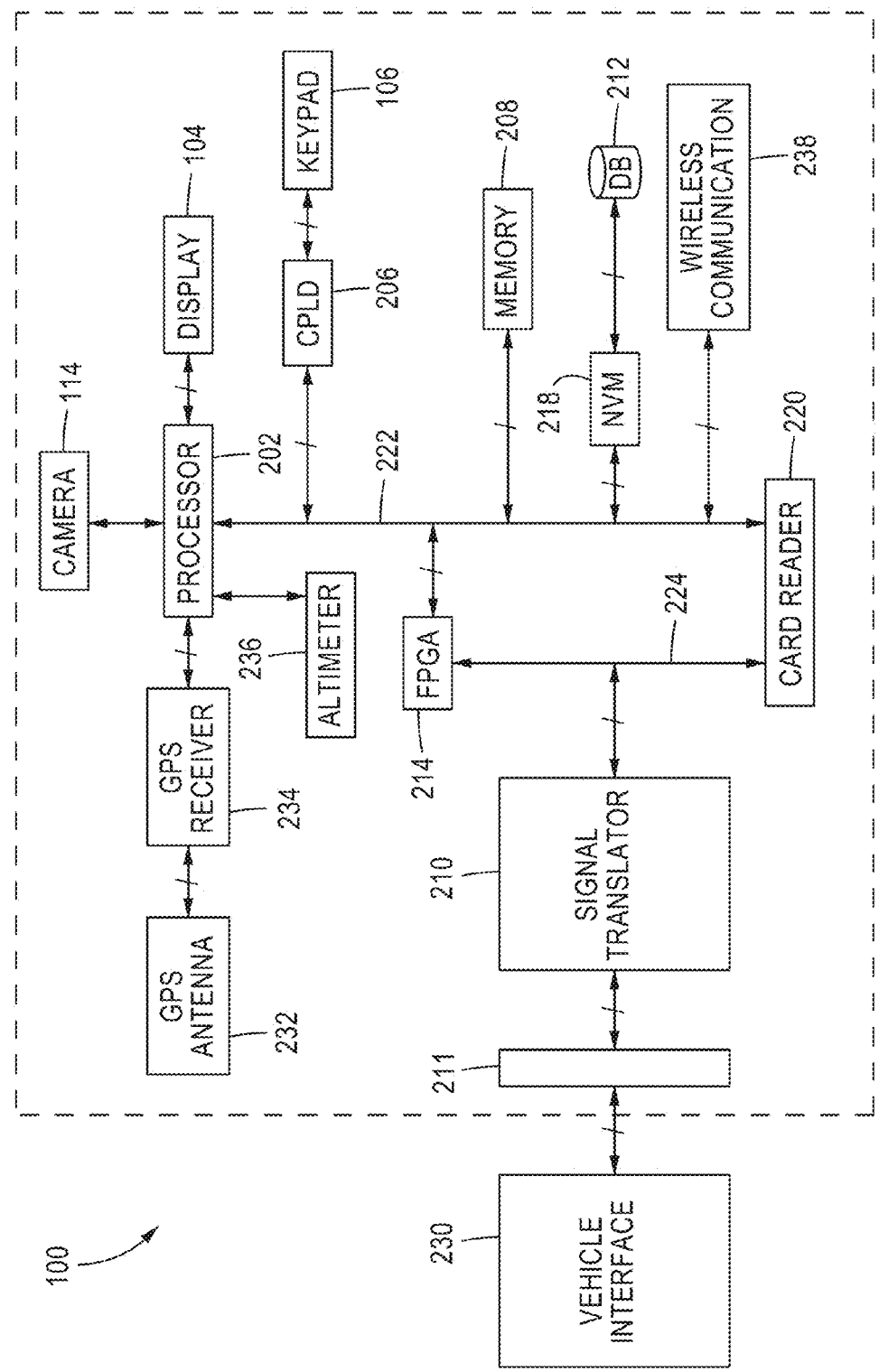
FIG. 2 is a block diagram of the components of the diagnostic tool of FIG. 1 according to an embodiment of the disclosure.

FIG. 2 is a block diagram of the components of the diagnostic tool 100 of FIG. 1 according to an embodiment of the disclosure. In FIG. 2, the diagnostic tool 100 according to an embodiment of the disclosure may include a camera 114, a processor 202, a field programmable gate array (FPGA) 214, a first system bus 224, the display 104, a complex programmable logic device (CPLD) 206, the input device 106 or function button, a memory 208, an internal non-volatile memory (NVM) 218 having a database 212 with software program, a card reader 220, a second system bus 222, a connector interface 211, a selectable signal translator 210, a GPS antenna 232, a GPS receiver 234, an optional altimeter 236, and a wireless communication circuit 238.

The wireless communication circuit 238 can be configured to communicate wirelessly with a vehicle communication interface that is coupled to the vehicle's data link connector (both not shown) or another remote device. The vehicle communication interface sends signals and vehicle data received from the various electronic control units (ECUs) in the vehicle. Wireless communication circuit 238 communicates with the processor 202 via the second system bus 222. The wireless communication circuit 238 can be configured to communicate via RF (radio frequency), satellites, cellular phones (analog or digital), Bluetooth®, Wi-Fi, Infrared, ZigBee, Local Area Networks (LAN), WLAN (Wireless Local Area Network), NFC (near field communication), other wireless communication configurations and standards, or a combination thereof. The wireless communication circuit 238 allows the diagnostic tool 100 to communicate with other devices wirelessly such as with a remote computing device (not shown) having remote databases. The wireless communication circuit 238 includes an antenna or transceiver built therein (not shown) and being housed within the housing 102 or can be externally located on the housing 102.

Signal translator 210 conditions signals received from an ECU unit through the wireless communication circuit 238 to a conditioned signal compatible with diagnostic tool 100. Signal translator 210 can communicate with, for example, the following communication protocols: J1850 (VPM and PWM), ISO 9141-2 signal, communication collision detection (CCD) (e.g., Chrysler collision detection), data communication links (DCL), serial communication interface (SCI), Controller Area Network (CAN), Keyword 2000 (ISO 14230-4), OBD II or other communication protocols that are implemented in a vehicle.

The circuitry to translate and send in a particular communication protocol can be selected by FPGA 214 (e.g., by tri-stating unused transceivers). Signal translator 210 may be also coupled to FPGA 214 and the card reader 220 via the first system bus 224. FPGA 214 transmits to and receives signals (i.e., messages) from the ECU unit through signal translator 210 and the wireless communication circuit 238.

The FPGA 214 may be coupled to the processor 202 through various address, data and control lines by the second system bus 222. FPGA 214 is also coupled to the card reader 220 through the first system bus 224. The processor 202 may also be coupled to the display 104 in order to output the desired information to the user. The processor 202 communicates with the CPLD 206 through the second system bus 222. Additionally, the processor 202 may be programmed to receive input from the user through the input device 106 via the CPLD 206 or via the touchscreen display 104. The CPLD 206 may provide logic for decoding various inputs from the user of the diagnostic tool 100 and also provides glue-logic for various other interfacing tasks.

Memory 208 and internal non-volatile memory 218 may be coupled to the second system bus 222, which allows for communication with the processor 202 and FPGA 214. Memory 208 can include an application dependent amount of dynamic random access memory (DRAM), a hard drive, and/or read only memory (ROM). Software to run the diagnostic tool 100 including the GUI can be stored in the memory 208 or 218, including any other database. The database 212 can include diagnostic information and other information related to vehicles.

Internal non-volatile memory 218 can be an electrically erasable programmable read-only memory (EEPROM), flash ROM, or other similar memory. Internal non-volatile memory 218 can provide, for example, storage for boot code, self-diagnostics, various drivers, and space for FPGA images, if desired. Additionally, the internal non-volatile memory 218 may also include software such as a graphics module for rendering and displaying graphics (e.g. icons or modules) on the touchscreen display 104. If less than all of the modules are implemented in FPGA 214, memory 218 can contain downloadable images so that FPGA 214 can be reconfigured for a different group of communication protocols.

A GPS antenna 232 and GPS receiver 234 can be included and may be mounted in or on the housing 102 or any combination thereof. The GPS antenna 232 electronically couples to the GPS receiver 234 and allows the GPS receiver to communicate (detects and decodes signals) with various satellites that orbit the Earth. In one embodiment, the GPS antenna 232 and GPS receiver 234 are one device instead of two. The GPS receiver 234 and GPS antenna 232 may electronically couple to the processor 202, which may be coupled to memory 208, 218 or a memory card in the card reader 220. The memories can be used to store cartographic data, such as electronic maps. The diagnostic tool can include all the maps for the U.S. (or country of use), North America, or can have the region or state where the diagnostic tool is located. In alternative embodiments, the diagnostic tool can have all the maps of the world or any portion of the world desired by the user. This allows the diagnostic tool to be a GPS device so that a driver can drive from one location to another. The maps may be overlay or may incorporate traffic, local events, and location of other GPS devices (smart phones), and other information that can be useful to the technician. By being able to locate other diagnostic tools with GPS, then the technicians may be able to use the diagnostic tools to locate each other in order to conduct a meeting or have a social event.

The GPS receiver communicates with and "locks on" to a certain number of satellites in order to have a "fix" on its global location. Once the location is fixed, the GPS receiver, with the help of the processor, can determine the exact location including longitude, latitude, altitude, velocity of movement, and other navigational data of the diagnostic tool 100.

Should the GPS receiver be unable to lock onto the minimum number of satellites to determine the altitude or unable to determine the altitude for any reason, the altimeter 236 can be used to determine the altitude of the diagnostic tool 100. The altimeter 236 is electronically coupled to the processor 202 and can provide the altitude or elevation of the diagnostic tool 100. The altimeter 236 can be coupled to a barometric pressure sensor (not shown) in order to calibrate the elevation measurements determined by the altimeter. The sensor can be positioned interior or exterior to the housing 102 of the diagnostic tool 100. Minor atmospheric pressure changes can affect the accuracy of the altimeter 236, thus, diagnostic tool can correct for these changes by using the sensor in conjunction with the altimeter 236 along with a correction factor known in the art.

In an alternative embodiment, a vehicle communication interface 230 of the vehicle under test is in communication with the diagnostic tool 100 through connector interface 211 via an external cable (not shown). Selectable signal translator communicates with the vehicle communication interface 230 through the connector interface 211.

Figure 3:
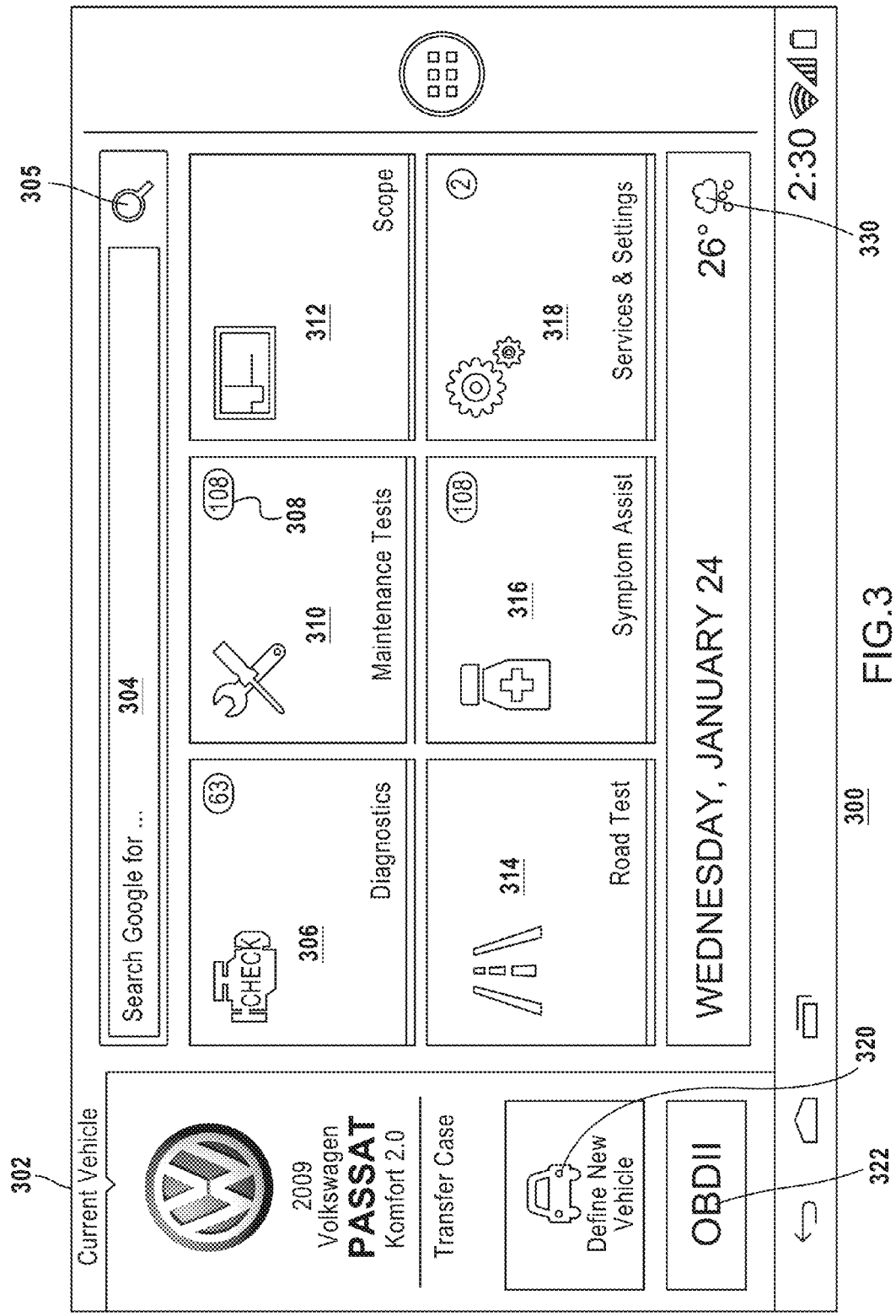
FIG. 3 illustrates an exemplary graphical user interface (GUI) according to an embodiment of the disclosure.

FIG. 3 illustrates an exemplary graphical user interface (GUI) 300 according to an embodiment of the disclosure. The GUI 300 may include various icons, information banner, modules, interface elements, and the like. The icons or modules may be activated by touching with a finger or a stylus and the like on the display 104 or through the user interface 106. The display 104 can be touch sensitive and is able to interpret finger contacts, finger tap gestures, finger swipe gestures, stylus movements, any combination thereof, and the like. It should be understood that, in some embodiments, one or more of the finger inputs are replaced with input from another input device (e.g., a mouse based input or stylus input). For example, a swipe gesture may be replaced with a mouse click (e.g., instead of a contact) followed by movement of the cursor along the path of the swipe (e.g., instead of movement of the contact). A further embodiment, a tap gesture may be replaced with a mouse click while the cursor is located over the location of the tap gesture (e.g., instead of detection of the contact followed by ceasing to detect the contact). Similarly, when multiple user inputs are simultaneously detected, it should be understood that multiple computer mice may be used simultaneously, or a mouse and finger contacts may be used simultaneously.

GUI 300 includes information banner 302 and icons or modules 306, 310, 312, 314, 316, 318, 320, and 322 (discussed below). In this example, information banner 302 provides information regarding the current vehicle under test, such as a 2009 Volkswagen Passat or any other vehicle. The information banner 302 includes new vehicle icon 320, which when selected enables a technician or user to enter information regarding the new vehicle. The entered information may include VIN (vehicle identification number), or other identifying information. OBDII icon 322 may be used to initiate a scan of the vehicle under test. In alternative embodiment, the scan is conducted automatically when the diagnostic tool 100 is coupled to a data link connector in a vehicle. The data link connector (not shown) provides access to various ECUs (electronic control unit) in the vehicle.

A text field 304 may also be present on the GUI 300. In one embodiment, the text field 304 may be a search field, in which the technician can enter keywords or terms to search using a search engine such as Google™, Bing™, Yahoo™ and the like. The search term or keywords may be entered into the text field 304 using the keypad 106 or a virtual keypad 106 that may appear when the text field 304 is touched with a finger or stylus. By having the text field 304, the technician can search for fixes, terms, bulletins, parts include location and pricing of the parts, or any other information in order to complete the diagnosis. The text field 304 may also be used to search any other information or topic such as baseball scores, news, weather, and the like. Once the search term or keyword is entered, the technician may touch the search icon 305 to start the search. In another embodiment, before or after the technician types in the text field 304, he can change the default search engine by tapping or touching search icon 305, which can cycle through or display the various search engines for selection.

Other icons or modules that may be display on the GUI 300 may include the diagnostic icon 306, maintenance test icon 310, scope icon 312, road test icon 314, symptom assist icon 316, and services and setting icon 318. There may be as many icons as the user desires. The diagnostic icon 306 when pressed or touched may bring up various diagnostic tests, such as sensor tests, emissions tests, or throttle position tests and the like. The maintenance test icon 310 when touched may perform maintenance tests such as inspection and maintenance and may retrieve I/M related emissions DTCs or monitors. Scope icon 312 when pressed may gather data from the scope such as an oscilloscope (automotive scope 3840F from Service Solutions U.S. LLC) attached to a portion of the vehicle under test.

Road test icon 314, when tapped, may put the diagnostic tool 100 into road test mode in order to gather vehicle diagnostic data during a road test. The road test allows a technician to gather vehicle data that may occur only during a road test such as intermittent stuttering of the vehicle at 30 mph. System assist icon 316 allows the technician to access on board or off-board diagnostic databases (discussed below) in order to assist the technician to diagnose an issue with the vehicle. Services and settings icon 318 allows the technician to change the settings in the diagnostic tool. The settings may include certain preferences such as units of measurements in metrics or U.S. units (discussed below).

Each of the icons discussed herein may have an indicator 308 that indicates that additional information is available related to the functionality of that particular icon or that a certain number of updates are available. For example, the indicator 308 for the system assist icon 316 shows 108 different available information that available at various databases to help to identify symptoms found in the vehicle. The available information may include top fixes, bulletins, videos, number of responses from a chat room or messages that have not been viewed, and the like that may be related to the vehicle data retrieved in order to help the technician to diagnose the symptoms.

A message banner 330 may also be present on the GUI 300. The message banner 330 may include information such as the date and the weather conditions at the location of the diagnostic tool 100. The message banner 330 may contain or display information desired by the user, including alerts, news feeds, weather at a different location or any other customizable information. The location may be based on the GPS location of the vehicle or diagnostic tool 100. It may also be based on location of the Wi-Fi connection or cellular connection to which the diagnostic tool 100 is connected to.

By knowing the weather condition, the diagnostic tool 100 can assist the technician in performing certain tests or alert the technician that the weather conditions are not optimal or may interfere with certain tests. For example, the weather may be too cold or too hot to run a vehicle battery test. The temperature may be measured optionally by a temperature sensor located on a surface of the diagnostic tool 100 or maybe received from an Internet-based source, such as www.weather.com and the like. Additional weather-related information may include barometric pressure and humidity levels, all of which may affect the testing be conducted by the technician.

Figure 4:
FIG. 4 illustrates another exemplary GUI according to an embodiment of the disclosure.

FIG. 4 illustrates another exemplary GUI 400 according to an embodiment of the disclosure. Icons or modules 402, 404, 406, 408, 410, 412, 414, 416, 418, 420, 422, 424, 426, and 428 are shown on GUI 400. New vehicle icon 402 when pressed allows the technician enter new vehicle. Alternatively, pressing of the new vehicle icon 402 may allow vehicle information to be transferred from another diagnostic tool to this diagnostic tool 100. AutoID icon 404 when pressed will instruct the diagnostic tool to perform the AutoID function and retrieve certain information such as VIN number from an ECU in a vehicle. Additional disclosure regarding AutoID can be found in an application entitled "SYSTEM AND METHOD FOR AUTOMATED VEHICLE SELECTION AND AUTOMATED FIX DETECTION," having U.S. patent application Ser. No. 13/606,850, filed on Sep. 7, 2012, the disclosure is hereby incorporated by reference in its entirety.

Heavy duty icon 406 when pressed may bring up different icons in order to diagnose heavy duty vehicles such as an 18 wheeler. VIN icon 408 when pressed may bring up a virtual keyboard 106 in order for a technician to enter vehicle identification number (VIN) and search for the corresponding vehicle that matches the VIN. Cancel icon 410 when pressed will cancel a function that was previously requested by user.

Vehicle icons or modules 412, 414, 416, 418, 420, 422, 424, 426, and 428 are icons or modules related to vehicles that are under test or previously tested. These icons may be arranged in the order of when the vehicle was last scanned or diagnosed. For example, vehicle icon 412 located in the top left-hand corner may be an icon of the vehicle currently being scanned or diagnosed by the technician. This may be indicated by a text on the icon such as "currently selected," or similar text. Vehicle icon 414 also shows a vehicle (Cadillac) that was scanned or diagnosed "2 hours ago."

Additionally, in one embodiment, vehicle icon 416 shows a vehicle (Mini) that was scanned or diagnosed "4 hours ago." It should be noted that these icons 412, 414 and 416 are shown "brightly lit," and icon 412 is the "brightest" compared to vehicle icons 418, 420, 422, and 424 which show that the respective vehicles were last scanned or diagnosed "yesterday," and thus, appear to decrease in brightness or starting to fade out. As more time since the last scan or diagnosis for respective vehicles passes, the vehicle icons fade even further. For example, vehicle icons 426 and 428 show the date on which the respective vehicles were last scanned or diagnosed and thus is further decreased in brightness or more faded out than the vehicle icons 418, 420, 422, and 424. The amount time that passes in which a vehicle was last scanned or diagnosed will determine the amount of decrease in brightness, or alternatively increase in brightness, for the respective vehicle icon. The amount time may be set as desired by the technician and may be in terms of minutes, hours, days, weeks, years, decades, and the like. Additionally, although in one embodiment, the far left vehicle icon may be the most bright, the placement of the brightest vehicle icon may be to the right. This allows technicians in other countries (such as Japan) or culture or personal preferences that may read from right to left to place the brightest icon in the far right-hand corner of the GUI 400. This may be done by using the services and settings icon 318 (FIG. 3).

Figure 5:
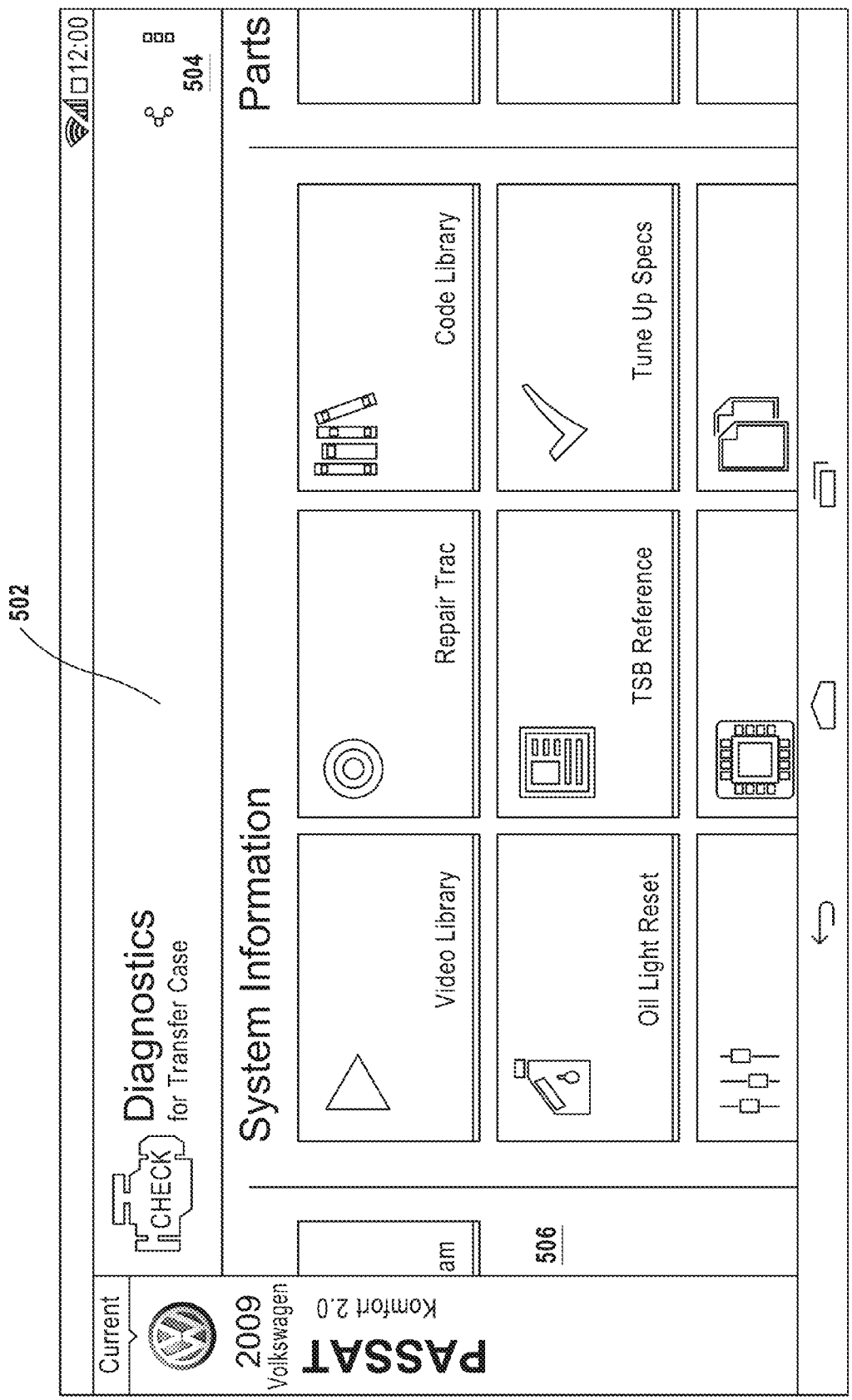
FIG. 5 illustrates a screen illustrating various panels according to an embodiment of the disclosure.

FIG. 5 illustrates a screen 500 illustrating various panels 502, 504, 506 according to an embodiment of the disclosure. In this embodiment, screen 500 illustrates a main panel 502 along with certain icons or modules that relate to a certain function or parameter such as system information. Right side panel 504 is shown as a "teaser" screen, which gives the technician a sneak peak of what icons or modules may be contained on the right side panel 504, such as parts information. For example, the icons or information may relate to parts such as schematics, videos, pictures, or the ability to purchase the parts based on a diagnosis that may be of interest to the technician. In the event the technician would like to see the icons or information contained on right side panel 504, he can simply swipe to the left using his finger or fingers and the right side panel 504 will replace the main panel 502 as the main panel. Any amount of the right side panel 504 may appear on screen 500 as desired by the user. Additionally, an identifier can be visible on the right side panel that is shown on screen 500 so that the user knows or can guess what icons or information may be contained on the right side panel 504.

In another embodiment, a left side panel 506 may also be present in conjunction with the right side panel 504. Alternatively, only the left side panel 506 or the right side panel 504 in conjunction with main panel 502 are displayed on screen 500. Similar to the functionality of the right side panel 504, the left side panel 506 may also be a "teaser" screen that allows the technician to know or guess what icons or information may be contained on the left side panel 506. An identifier can be located on the right side or the upper right side of the left side panel 506 so that the technician knows what icons are on the left side panel 506.

Alternatively, the left and right side panels 504, 506 may also be positioned above or below main panel 502. By having these "teaser" screens or panels, they may replace the vertical menus selection that are typically used in menus and make them horizontal for faster viewing. Thus, left and right side panels 504, 506 may also be a continuation of additional icons under the same information category such as additional icons for diagnosing a vehicle that could not be displayed on one panel.

Figure 6:
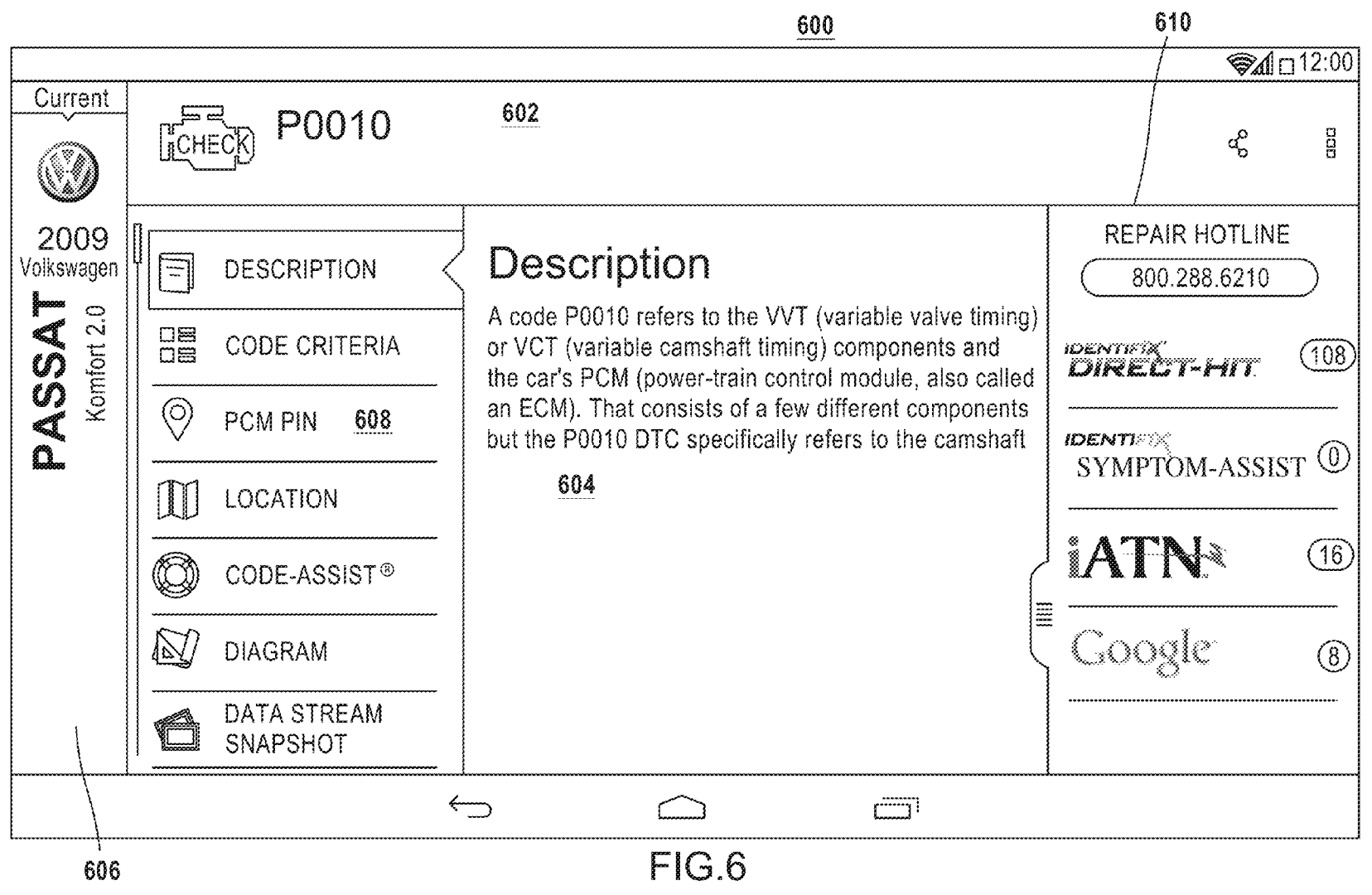

FIG. 6 illustrates a screen 600 having on board and off-board indicators according to an embodiment of the disclosure. Message banner 606 may show information about the vehicle that is currently under test. In the screen 600, the diagnostic tool 100 has retrieved a DTC, such as P0010 as shown on message banner 602. A description box 604 may "pop out" when an icon 608 such as the description icon is pressed by the technician. Description box 604 can provide additional information about the P0100 DTC that is set in the vehicle. Additionally, icons 608 on the left side of the screen 600 indicate to the user that certain on board tools or databases are available that relates to that particular DTC or issue that the technician is trying to diagnose. One such database can be the "code assist" that may exist in database 212 (FIG. 2). On the right side of the screen 600, icons 610 indicate to the user that certain off-board databases such as iATN™, Google™, Direct-Hit™ and Symptom-Assist™ are available that relates to that particular DTC or issue. By displaying on screen 600 both on board tools in the form of icons 608 and off-board tools in the form of icons 610, the technician can select the proper database or by preference. The proper database may be based on the time in which it takes to retrieve the additional information to diagnose the component that caused the DTC to be set in the ECU. For example, it may be faster to retrieve the additional information from an onboard tool versus and off-board tool, which may require the technician to have a wired or wireless connection to request the information from a remote server or computing device on which the off-board database is stored. Thus in this embodiment, if one or both of the tools are available, the technician can decide which tool to use is best for him. Additionally, the technician may prefer to use the off-board tools as they may be updated more often than the on-board tools.

Figure 7:
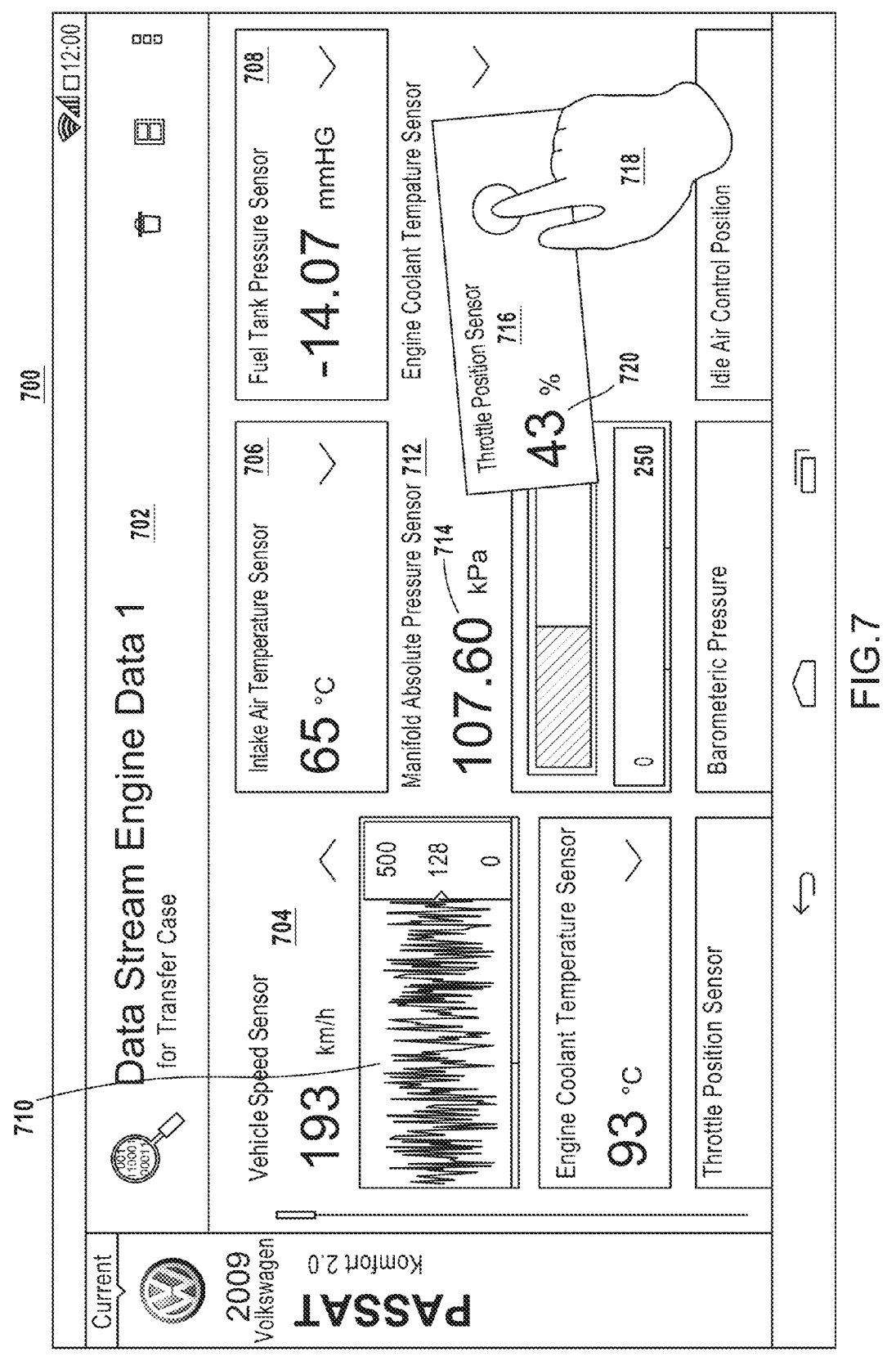

FIG. 7 illustrates a GUI 700 having icons with vehicle diagnostic data according to an embodiment of the disclosure. GUI 700 includes a message banner 702 showing data stream engine. Icons or modules 704, 706, 708, 712 and 716 can be vehicle data icons showing various retrieved vehicle data. For example, icon 704 shows vehicle diagnostic data regarding vehicle speed, icon 706 shows intake air temperature, icon 708 shows fuel tank pressure, icon 712 shows manifold absolute pressure, and icon 716 shows throttle position.

The vehicle diagnostic data icons may show the data in various forms including numerical 714, percentage 720, graph 710, and the like. The forms may be changed by the technician by tapping on the respective icon or a portion of the icon containing the numerical 714, percentage 720, or graph 710 in order to change from one form to another. Additionally, the forms and icons may also be changed as to color, size, shading, and the like depending on the preferences of the technician. The numerical unit 714 shown on the forms for example may be changed from metrics to U.S. units and vice versa by also tapping the respective icon or portion of the icon. Further, the title of the respective icons may change in color to indicate whether the data value is within, over or under a predetermined range for the particular data value being recorded. The color may be blue for within the predetermined range, red for being over the predetermined range, and yellow for under the predetermined range. However, any color can be used to signify the data value in relation to the predetermined range as desired by the technician.

In another embodiment, all the icons or individual icon can be programmed or customized to show only metrics or U.S. units or both. The icons can also be programmed to show metrics based on the manufacturer of the vehicle under test, such as BMW, or U.S. units for US manufacture such as Ford. Further the icons can also be programmed to show metrics or U.S. units depending on the location of the diagnostic tool 100, based on user preference as part of a login ID or the language selected for the diagnostic tool.

Also shown on FIG. 7, is a hand 718 representing a hand or a finger of the technician moving icon 716. The GUI 700 may change depending on the preference of the user. That is, the respective icons or modules 704, 706, 708, 712, and 716 may be moved to other portions of the GUI 700. Movement of the icon may be done with finger, stylus, user interface 106, or the like. The GUI 700 is configured to move the other respective icons in relation to the icon (in this case 716) in order to place the icon at a location on GUI 700 as desired by the technician.

Further, the icon may be placed at an angle as shown in FIG. 7. Because icon 716 appears at an angle different from the remaining icons this may quickly attract the eyes of the technician in order to quickly view the icon that he's really interested in. This may be helpful when the data changes rapidly and the technician wants to be sure to focus on that icon.

Figure 8:
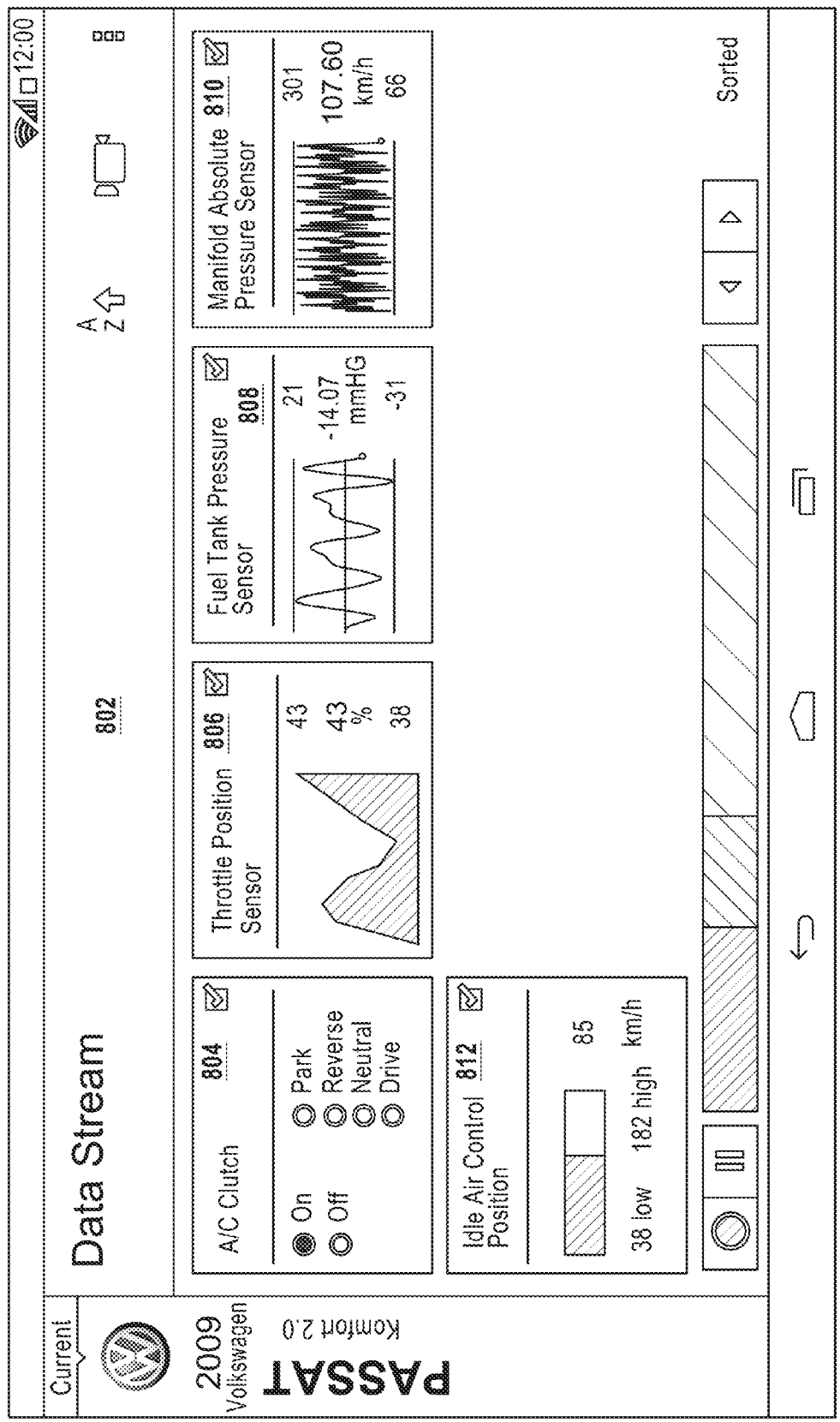
FIG. 8 illustrates a GUI having various data stream icons according to an embodiment of the disclosure.

FIG. 8 illustrates GUI 800 having various data stream icons according to an embodiment of the disclosure. GUI 800 includes a message banner 802 showing a data stream that is being recorded by the diagnostic tool 100. The data icons shown in GUI 800 include data icon 804 for A/C clutch, data icon 806 for throttle position, data icon 808 for fuel tank pressure, data icon 810 for manifold absolute pressure, and data icon 812 for idle air control position. As previously discussed, these icons may include numerical, graphical, percentage and the like to show the data being retrieved.

In one embodiment, in the event that the user would like to zoom in to see a larger display of information about the data on a particular icon, he may simply use one or 2 finger gestures to make the portion of the GUI or icon bigger. Alternatively, the user can also make a particular icon smaller by using one or 2 finger gestures.

Figure 9:
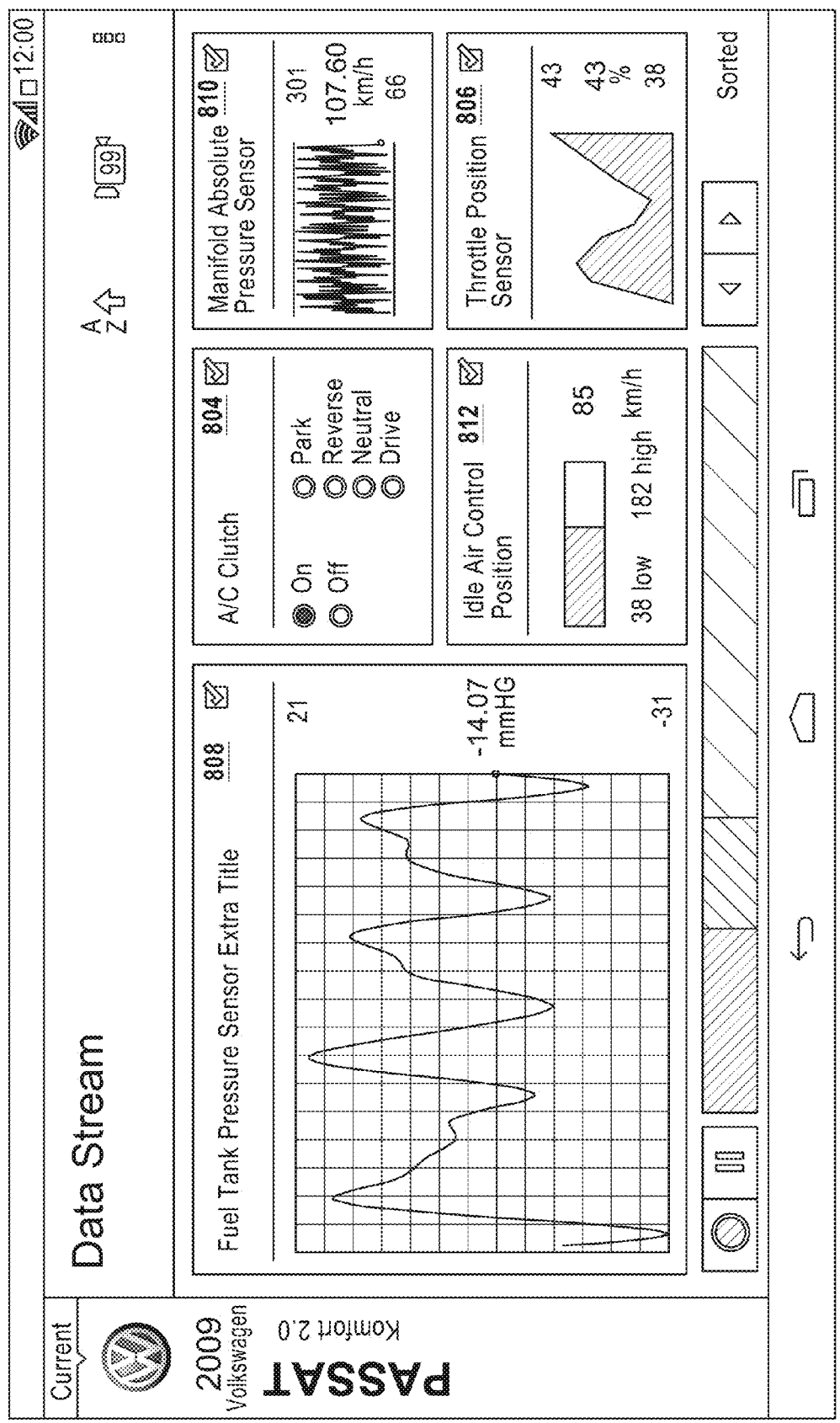
FIG. 9 illustrates a GUI having its icons rearranged according to an embodiment of the disclosure.

FIG. 9 illustrates GUI 800 having its icon rearranged according to an embodiment of the disclosure. As shown in FIG. 9, GUI 800 has now been changed based on a gesture via finger(s) and/or stylus, and the like so that data icon 808 is now larger or is zoomed in relation to the other icons on GUI 800. The remaining data icons 804, 806, 810, 812 have been rearranged or repositioned to accommodate the now larger data icon 808. The remaining data icons 804, 806, 810, 812 may be repositioned to fill the remaining portion of the GUI 800 as shown in FIG. 9 or can be repositioned to fill only a portion of the GUI 800.

Figure 10:
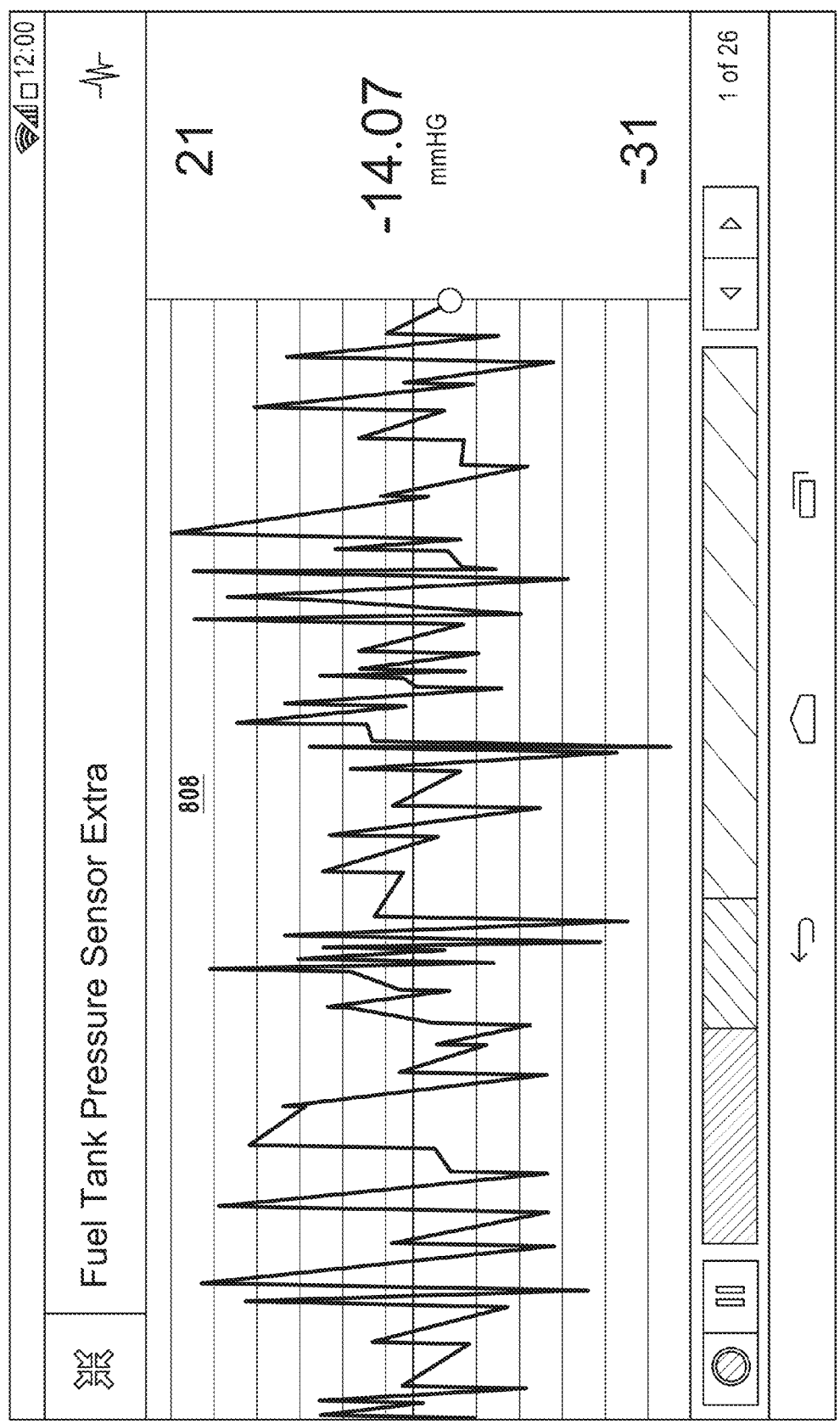
FIG. 10 illustrates a full screen of the data icon of FIG. 8 according to embodiment of the disclosure.

FIG. 10 illustrates a full screen of the data icon 808 of FIG. 8 according to embodiment of the disclosure. In the event that the user would like to view the data icon, such as data icon 808 in a full view mode, the user may use a gesture via finger(s) and/or stylus and the like to make the data icon 808 as large or small as he likes. In full view mode, the entire GUI 800 shows only the icon 808 and its data or only the data/graph part.

The many features and advantages of the disclosure are apparent from the detailed specification, and thus, it is intended by the appended claims to cover all such features and advantages of the disclosure which fall within the true spirit and scope of the disclosure. Further, since numerous modifications and variations will readily occur to those skilled in the art, it is not desired to limit the disclosure to the exact construction and operation illustrated and described, and accordingly, all suitable modifications and equivalents may be resorted to, falling within the scope of the disclosure.

What is claimed is:

1. A diagnostic tool, comprising:
a processor that performs a function of the diagnostic tool;
a display in communication with the processor;
a wireless communication interface in communication with the processor and configured to communicate with a remote device having at least a remote diagnostic database;
a vehicle communication protocol interface operatively coupled to the processor and configured to allow the processor to communicate with a vehicle under test to retrieve diagnostic information including diagnostic trouble codes (DTCs) and vehicle data streams;
a temperature sensor positioned on a surface of the diagnostic tool; and
a memory in communication with the processor, the memory containing instructions, that when executed by the processor causes the processor to generate, on the display, a graphical user interface (GUI) configured to display:
a message banner positioned on the GUI that includes information about the vehicle data streams;
a first panel having a plurality of selectable icons positioned on the GUI and the plurality of selectable icons corresponds to the vehicle data streams retrieved by the processor, wherein at least one of the first plurality of selectable icons is configured to be resizable, and placeable by a user of the diagnostic tool at an angle different from the other first plurality of selectable icons when data represented by the at least one of the first plurality of selectable icons changes; and
a second panel positioned on either side of the first panel on the GUI and having the plurality of selectable icons, wherein the second panel is only partially displayed to provide the user information as to functions of the plurality of selectable icons.

2. The diagnostic tool of claim 1, wherein each of the plurality of selectable icons further includes a changeable unit of measurement.

3. The diagnostic tool of claim 1, wherein when the at least one of the first plurality of selectable icons is pressed, the pressed selectable icon is resized.

4. The diagnostic tool of claim 3, wherein when the pressed selectable icon is resized, the plurality of selectable icons adjusts or moves in the GUI.

5. The diagnostic tool of claim 3, wherein the pressed selectable icon is resized to be smaller or larger than the plurality of selectable icons.

6. The diagnostic tool of claim 3, wherein the pressed selectable icon is resized using finger gestures.

7. The diagnostic tool of claim 3, wherein the pressed selectable icon is resized to fit an entire portion of the GUI.

8. A non-transitory machine-readable storage medium comprising machine-readable instructions for causing a processor of a diagnostic tool to execute:
instructions executed on the processor for generating, on a display, a graphical user interface (GUI) comprising:
a message banner positioned on the GUI that includes information about vehicle data streams;
a first panel having a plurality of selectable icons positioned on the GUI and the plurality of the selectable icons corresponds to the vehicle data streams retrieved by the processor,
wherein at least one of the first plurality of selectable icons is configured to be resizable, and placeable by a user of the diagnostic tool at an angle different the plurality of selectable icons when data represented by the at least one of the plurality of selectable icons changes; and
a second panel positioned on either side of the first panel on the GUI and having the plurality of selectable icons, wherein the second panel is only partially displayed to provide the user information as to functions of the plurality of selectable icons.

9. The non-transitory machine-readable storage medium of claim 8, wherein each of the plurality of selectable icons further includes a changeable unit of measurement.

10. The non-transitory machine-readable storage medium of claim 8, wherein when the at least one of the plurality of selectable icons is pressed, the pressed selectable icon is resized.

11. The non-transitory machine-readable storage medium of claim 10, wherein when the pressed selectable icon is resized, the plurality of selectable icons adjust or move in the GUI.

12. The non-transitory machine-readable storage medium of claim 10, wherein the pressed selectable icon is resized to be smaller or larger than the plurality of selectable icons.

13. The non-transitory machine-readable storage medium of claim 10, wherein the pressed selectable icon is resized using finger gestures.

14. The non-transitory machine-readable storage medium of claim 10, wherein the pressed selectable icon is resized to fit an entire second portion of the GUI.

15. A computer-implemented method for resizing icons on a display of a diagnostic tool, the method comprising:
   executing instructions on a processor for generating, on a display, a graphical user interface (GUI) comprising:
      a message banner positioned on the GUI that includes information about a vehicle data stream;
      a first panel having a plurality of selectable icons positioned on the GUI and the plurality of selectable icons corresponds to the vehicle data stream retrieved by the processor,
      wherein at least one of the plurality of selectable icons is configured to be resizable, and placeable by a user of the diagnostic tool at an angle different from the plurality of selectable icons when data represented by the at least one of the plurality of selectable icons changes; and
      a second panel positioned on either side of the first panel of the GUI and having the plurality of selectable icons, wherein the second panel is only partially displayed to provide the user information as to functions of the plurality of selectable icons.

16. The computer-implemented method of claim 15, wherein when the at least one of the plurality of icons is pressed, the pressed selectable icon is resized.

17. The computer-implemented method of claim 16, wherein when the pressed selectable icon is resized, the plurality of selectable icons adjust or moves in the GUI.

18. The computer-implemented method of claim 16, wherein the pressed selectable icon is resized to be smaller or larger than the plurality of selectable icons.

19. The computer-implemented method of claim 16, wherein the pressed selectable icon is resized using finger gestures.

20. The computer-implemented method of claim 16, wherein the pressed selectable icon is resized to fit an entire second portion of the GUI.

* * * * *